United States Patent
Chen et al.

(10) Patent No.: US 9,837,964 B2
(45) Date of Patent: Dec. 5, 2017

(54) AMPLIFIER SYSTEM AND DEVICE

(71) Applicant: ZTE Corporation, Shenzhen (CN)

(72) Inventors: Huazhang Chen, Shenzhen (CN); Fan Zhang, Shenzhen (CN); Xiaojun Cui, Shenzhen (CN)

(73) Assignee: XI'AN ZHONGXING NEW SOFTWARE CO. LTD., Xi'An (CN)

( * ) Notice: Subject to any disclaimer, the term of this patent is extended or adjusted under 35 U.S.C. 154(b) by 0 days.

(21) Appl. No.: 15/106,309

(22) PCT Filed: Jul. 9, 2014

(86) PCT No.: PCT/CN2014/081913
§ 371 (c)(1),
(2) Date: Jun. 19, 2016

(87) PCT Pub. No.: WO2015/090050
PCT Pub. Date: Jun. 25, 2015

(65) Prior Publication Data
US 2017/0033745 A1 Feb. 2, 2017

(30) Foreign Application Priority Data

Dec. 18, 2013 (CN) .......................... 2013 1 0698975

(51) Int. Cl.
*H03G 3/20* (2006.01)
*H03F 1/02* (2006.01)
(Continued)

(52) U.S. Cl.
CPC ....... *H03F 1/0216* (2013.01); *H01L 29/7816* (2013.01); *H03F 1/0205* (2013.01);
(Continued)

(58) Field of Classification Search
CPC ..................................................... H03G 3/20
(Continued)

(56) References Cited

U.S. PATENT DOCUMENTS 7,253,685 B2    8/2007 Chung
7,605,651 B2 *  10/2009 Ripley ................ H03F 1/0233
                                                    330/133

(Continued)

FOREIGN PATENT DOCUMENTS

CN    2545778       4/2003
CN    201303314 Y   9/2009
(Continued)

OTHER PUBLICATIONS

International Search Report for corresponding application No. PCT/CN2014/081913 filed on Jul. 9, 2014; dated Oct. 15, 2014.

*Primary Examiner* — Henry Choe
(74) *Attorney, Agent, or Firm* — Cantor Colburn LLP

(57) ABSTRACT

The disclosure discloses an amplifier system and a device The amplifier system includes: at least two stages of amplifiers which are sequentially connected, wherein a static working current value of an $N^{th}$-stage amplifier in the at least two stages of amplifiers is a value obtained by decreasing a first value by a first pre-set multiple, and a static working current value of an $(N-1)^{th}$-stage amplifier in the at least two stages of amplifiers is a value obtained by increasing a second value by a second pre-set multiple; the first value is a recommended static working current value corresponding to the $N^{th}$-stage amplifier, wherein N is any integer greater than or equal to 2; and the second value is a recommended static working current value corresponding to the $(N-1)^{th}$-stage amplifier. The solution effectively improves power amplification efficiency in a case of guaranteeing a linearity of a power amplification link.

14 Claims, 4 Drawing Sheets

(51) Int. Cl.
*H03F 3/195* (2006.01)
*H03F 3/24* (2006.01)
*H01L 29/78* (2006.01)
*H03F 3/21* (2006.01)

(52) U.S. Cl.
CPC ........... *H03F 1/0261* (2013.01); *H03F 3/195* (2013.01); *H03F 3/21* (2013.01); *H03F 3/245* (2013.01); *H03F 2200/18* (2013.01); *H03F 2200/405* (2013.01); *H03F 2200/408* (2013.01); *H03F 2200/411* (2013.01)

(58) Field of Classification Search
USPC ........................................ 330/133, 134, 297
See application file for complete search history.

(56) References Cited

U.S. PATENT DOCUMENTS

| | | | | |
|---|---|---|---|---|
| 7,808,312 B2* | 10/2010 | Ichitsubo | .............. | H03F 1/0261 |
| | | | | 330/129 |
| 8,476,976 B2* | 7/2013 | Wimpenny | ........... | H03F 1/0211 |
| | | | | 330/127 |
| 2009/0174475 A1* | 7/2009 | Yuen | .................... | H03F 1/0216 |
| | | | | 330/133 |

FOREIGN PATENT DOCUMENTS

| | | |
|---|---|---|
| CN | 101951226 A | 1/2011 |
| CN | 102291091 A | 12/2011 |

\* cited by examiner

AMPLIFIER SYSTEM AND DEVICE

TECHNICAL FIELD

The disclosure relates to the communications field, and in particular to an amplifier system and a device.

BACKGROUND

With the rapid development of mobile communications, a power amplification circuit is more and more widely applied to a base station and a mobile terminal, cascaded application occasions are increasing, and requirements for efficiency and linear indexes are increasingly high. How to meet a linear requirement of an amplification circuit and continuously improve the efficiency has become a new challenge for a design of a power amplifier.

As a current industry mainstream device, a Laterally Diffused Metal Oxide Semiconductor (LDMOS) field-effect tube has been widely applied by virtue of good performance indexes, reliable stability and other advantages. One of working characteristics of the LDMOS field-effect tube is that a gain characteristic of an LDMOS will change along with a change of a static working current, that is, a gain shape depends on the static working current of the LDMOS field-effect tube. FIG. 1 and FIG. 2 are typical gain curves of LDMOS field-effect tubes in different power levels.

From the gain curves of the LDMOS field-effect tubes, it can be seen that the static working current of each LDMOS field-effect tube remarkably affects the amplification characteristic of each LDMOS field-effect tube, particularly, when an input power is relatively low. Meanwhile, the characteristic does not change due to a difference of the power levels of the LDMOS field-effect tubes.

A cascaded LDMOS field-effect tube is adopted in the current industry to achieve power amplification, and each stage of LDMOS field-effect tube is set in accordance with a recommended static working current so as to guarantee a consistency of large and small signal gains of all stages of LDMOS field-effect tubes. Although this mode can guarantee a good linearity of a cascaded amplifier, an efficiency of an entire link is not high.

SUMMARY

The embodiments of the disclosure provide an amplifier system and a device, so as to improve power amplification efficiency in a case of guaranteeing a linearity of a power amplification link.

In order to solve the technical problem, an embodiment of the disclosure provides an amplifier system, which may include:

at least two stages of amplifiers which are sequentially connected, wherein a static working current value of an $N^{th}$-stage amplifier in the at least two stages of amplifiers is a value obtained by decreasing a first value by a first pre-set multiple, and a static working current value of an $(N-1)^{th}$-stage amplifier in the at least two stages of amplifiers is a value obtained by increasing a second value by a second pre-set multiple; the first value is a recommended static working current value corresponding to the $N^{th}$-stage amplifier, wherein N is any integer greater than or equal to 2; and the second value is a recommended static working current value corresponding to the $(N-1)^{th}$-stage amplifier.

In an example embodiment, the $N^{th}$-stage amplifier is an amplifier, having a maximum power capacity, in the at least two stages of amplifiers.

In an example embodiment, the $N^{th}$-stage amplifier is a last-stage amplifier in the at least two stages of amplifiers.

In an example embodiment, each of the at least two stages of amplifiers works in a class AB.

In an example embodiment, each of the at least two stages of amplifiers is an amplifier adopting a Laterally Diffused Metal Oxide Semiconductor (LDMOS) field-effect tube.

In an example embodiment, the first pre-set multiple and the second pre-set multiple are any values between 0.4 and 0.6.

In an example embodiment, further including: at least two bias circuits, correspondingly connected with the at least two stages of amplifiers and configured to control corresponding amplifiers to work stably.

In an example embodiment, each of the at least two bias circuits include: a voltage adjustment element, configured to adjust a gate voltage of a corresponding amplifier; a temperature compensation element, connected with the voltage adjustment element; and a stability resistor, connected with the temperature compensation element.

In an example embodiment, further including: a power supply network, respectively connected with the at least two stages of amplifiers and the at least two bias circuits, and configured to supply power to the at least two stages of amplifiers and the at least two bias circuits.

In order to solve the technical problem, an embodiment of the disclosure also provides a device, which may include: the amplifier system mentioned above.

The technical solutions in the embodiments of the disclosure have the beneficial effects as follows.

The amplifier system provided by the embodiments of the disclosure includes: the at least two stages of amplifiers which are sequentially connected, wherein the static working current value of the $N^{th}$-stage amplifier in the at least two stages of amplifiers is the value obtained by decreasing a first value by a first pre-set multiple, and the static working current value of the $(N-1)^{th}$-stage amplifier in the at least two stages of amplifiers is the value obtained by increasing a second value by a second pre-set multiple; and the first value is the recommended static working current value corresponding to the $N^{th}$-stage amplifier, and the second value is the recommended static working current value corresponding to the $(N-1)^{th}$-stage amplifier, wherein N is any integer greater than or equal to 2. By flexibly configuring each static working current of a cascaded amplifier, the power amplification efficiency is improved in the case of guaranteeing the linearity of a power amplification link.

DETAILED DESCRIPTION

In order to make the technical problem to be solved by the disclosure, the technical solutions and the advantages clearer, detailed descriptions will be made below with reference to the drawings and specific embodiments.

Figure 3:
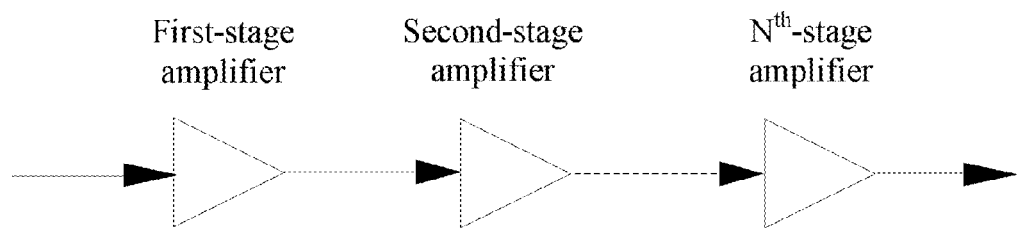
FIG. 3 is a structural schematic diagram of an amplifier system according to an embodiment of the disclosure.

As shown in FIG. 3, an amplifier system provided by an embodiment of the disclosure includes:

at least two stages of amplifiers which are sequentially connected, wherein a static working current value of an $N^{th}$-stage amplifier in the at least two stages of amplifiers is a value obtained by decreasing a first value by a first pre-set multiple, and a static working current value of an $(N-1)^{th}$-stage amplifier in the at least two stages of amplifiers is a value obtained by increasing a second value by a second pre-set multiple;

the first value is a recommended static working current value corresponding to the $N^{th}$-stage amplifier, wherein N is any integer greater than or equal to 2; and the second value is a recommended static working current value corresponding to the $(N-1)^{th}$-stage amplifier.

In the amplifier system provided by the embodiment of the disclosure, the static working current value C1 of the $N^{th}$-stage amplifier is the value obtained by decreasing a first value X by a first pre-set multiple W, and the static working current value C2 of the $(N-1)^{th}$-stage amplifier is the value obtained by increasing a second value Y by a second pre-set multiple Z; and specifically, $C1=X-X*W$, and $C2=Y+Y*Z$, wherein the first value X is the recommended static working current value corresponding to the $N^{th}$-stage amplifier, and the second value Y is the recommended static working current value corresponding to the $(N-1)^{th}$-stage amplifier, N is any integer greater than or equal to 2. By flexibly configuring each static working current of a cascaded amplifier, the power amplification efficiency is improved in the case of guaranteeing the linearity of a power amplification link.

Moreover, the $N^{th}$-stage amplifier is an amplifier, having the maximum power capacity, in the at least two stages of amplifiers.

In this case, a proportion of a static power consumption of the $N^{th}$-stage amplifier in a static power consumption of an entire amplification link is highest. By decreasing the static working current of the $N^{th}$-stage amplifier, the static power consumption of the $N^{th}$-stage amplifier can be reduced, thereby effectively improving the power amplification efficiency of the amplification link. Meanwhile, by increasing the static working current of the $(N-1)^{th}$-stage amplifier, it is guaranteed that overall gains of the amplification link in case of large and small signals are basically consistent, and the linearity conditions of the amplification link are guaranteed.

Moreover, the large and small signals are signal classification with respect to a dynamic amplifier range, and are descriptions for amplifier characteristics from two different levels or perspectives. Any practical device is not ideally linear, particularly, within the entire dynamic range. If a signal is limited within a relatively small and approximately linear range in the entire dynamic range, an approximately linear model namely a small signal model is obtained by stripping a direct current bias and extracting differential characteristics thereof, which will facilitate analysis and design. But if the range of the signal is relatively wide, that is, the range of the signal is close to the dynamic range of the device, the small signal model will not be effective, it is necessary to consider device characteristics under a large signal (full power), the large and small signals are parameters used in two different occasions, and a certain correlation exists therebetween.

Moreover, the $N^{th}$-stage amplifier is a last-stage amplifier in the at least two stages of amplifiers. In this case, a power capacity of the $N^{th}$-stage amplifier under a default condition is maximum, and the proportion of the static power consumption in the static power consumption of the entire amplification link is highest. By decreasing the static working current of the $N^{th}$-stage amplifier, the power amplification efficiency of the $N^{th}$-stage amplifier can be effectively improved.

In addition, an amplifier working in a class A refers to an amplifier, a current continuously flowing through all output devices of the amplifier. An amplifier working in a class B refers to an amplifier with a conduction time of devices being 50 percent. An amplifier working in a class AB refers to an amplifier with a conduction time of devices being between 50 percent and 100 percent. Thus, the linearity and efficiency of a class AB working state are between those of a class A working state and those of a class B working state. As different static working points can determine different working states of amplifiers, a working state of a field-effect tube can be changed by appropriately adjusting the static working current of each device so as to achieve the change of different working states of the amplifiers.

Specifically, each of the at least two stages of amplifiers works in the class AB respectively.

In an example embodiment, each of the at least two stages of amplifiers is an amplifier adopting an LDMOS field-effect tube.

In this case, by adjusting the static working currents of the amplifiers, under the condition of a consistency of large and small signal gains of all stages of LDMOS field-effect tubes, the power amplification efficiency can be improved, and the practicality of a device is improved. Moreover, by reasonably configuring each stage of gain, effective power transmission can be guaranteed, and power losses caused by bad matching are reduced.

In an example embodiment, other stages of amplifiers, except the $N^{th}$-stage amplifier and the $(N-1)^{th}$-stage amplifier, in the at least two stages of amplifiers work under corresponding recommended static working current values respectively.

In this case, under the recommended static working current values, large-small signal amplification characteristics of all stages of amplifiers are consistent, and cascaded amplification characteristics are also consistent, thereby guaranteeing that the amplification characteristic of the entire link is not changed along with the amplitude change of signals, and guaranteeing the good linearity of the entire link.

In an example embodiment, the first pre-set multiple and the second pre-set multiple are any values between 0.4 and 0.6.

In this case, suppose the recommended static working current value of the $N^{th}$-stage amplifier is B milliamp and the recommended static working current value of the $(N-1)^{th}$-stage amplifier is A milliamp, the static working current value of the $N^{th}$-stage amplifier is adjusted to $(0.4-0.6)*B$ milliamp, and the static working current value of the $(N-1)^{th}$-stage amplifier is adjusted to $(1.4-1.6)*A$ milliamp, so that the power amplification efficiency is effectively improved under the condition of guaranteeing the linearity of a power amplification link.

Figure 1:
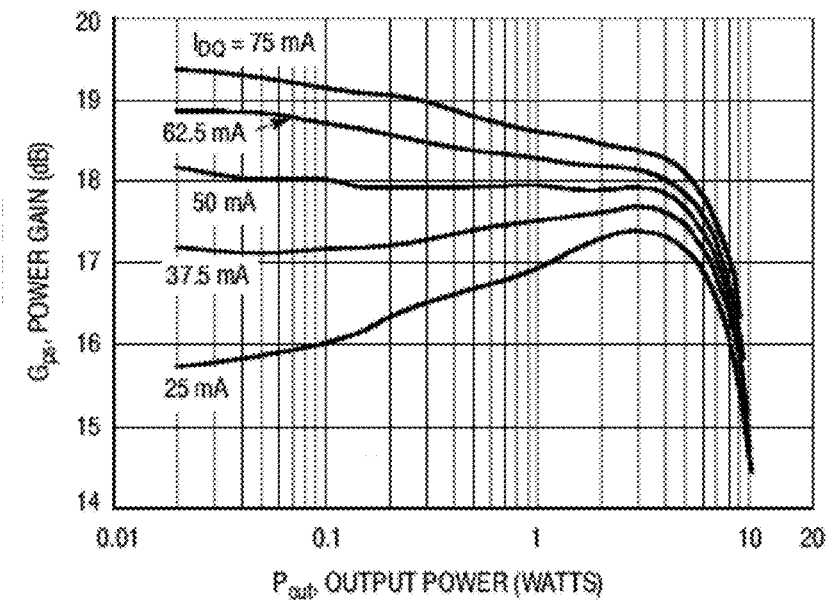
FIG. 1 is a typical gain curve 1 of an LDMOS field-effect tube in the related art.
Figure 2:
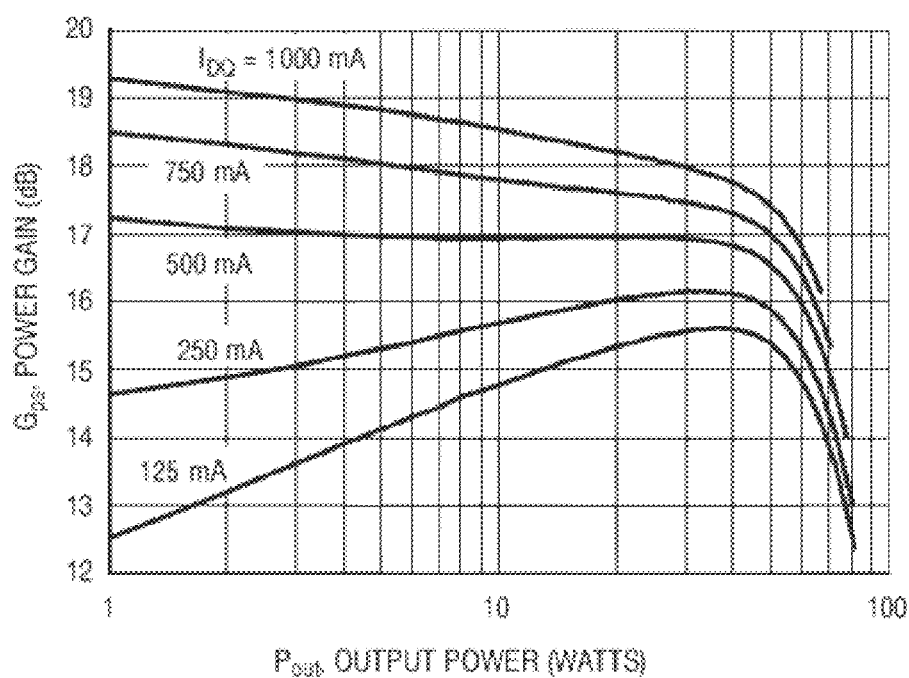
FIG. 2 is a typical gain curve 2 of an LDMOS field-effect tube in the related art.

Two stages of cascaded amplifiers are taken as an example. The first-stage cascaded amplifier and the second-stage cascaded amplifier are amplifiers adopting LDMOS field-effect tubes and work in a class AB respectively. Suppose corresponding relationship curves between POWER GAINS of the first-stage cascaded amplifier and the second-stage cascaded amplifier and an OUTPUT POWER are shown in FIG. 1 and FIG. 2 respectively, the element of each gain $G_{ps}$ is dB, and the element of the output power $P_{out}$ is WATTS.

Figure 4:
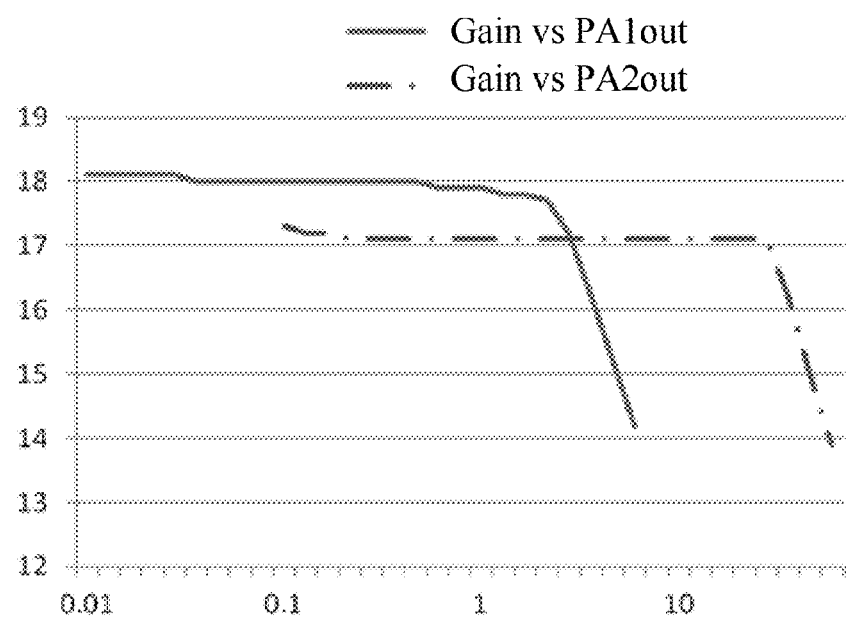
FIG. 4 is a gain curve of each stage of amplifier of an amplifier system in the related art.
Figure 5:
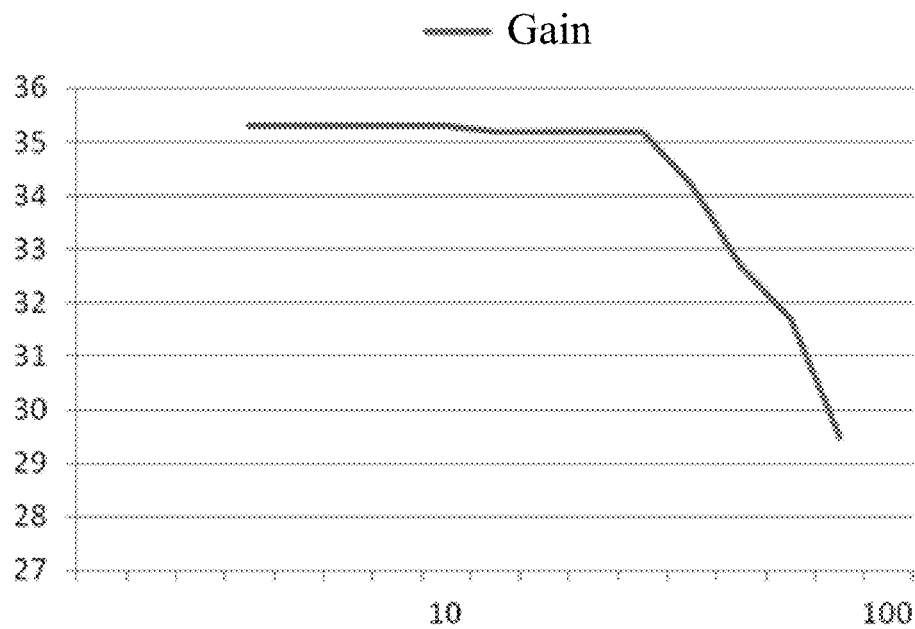
FIG. 5 is a gain curve of all cascaded stages of amplifiers of an amplifier system in the related art.

Moreover, in accordance with a related method for adjusting a static working current $I_{DQ}$, that is, if the first-stage amplifier and the second-stage amplifier work under respective recommended static working current values, the corresponding relationship curve Gain vs PA1Out between a gain and an output of the first-stage amplifier and the corresponding relationship curve Gain vs PA2Out between a gain and an output of the second-stage amplifier are shown in FIG. 4 respectively. In this case, large-small signal amplification characteristics of both stages of amplifiers are consistent, and cascaded amplification characteristics are also consistent. A cascaded gain curve Gain is shown in FIG. 5.

Figure 6:
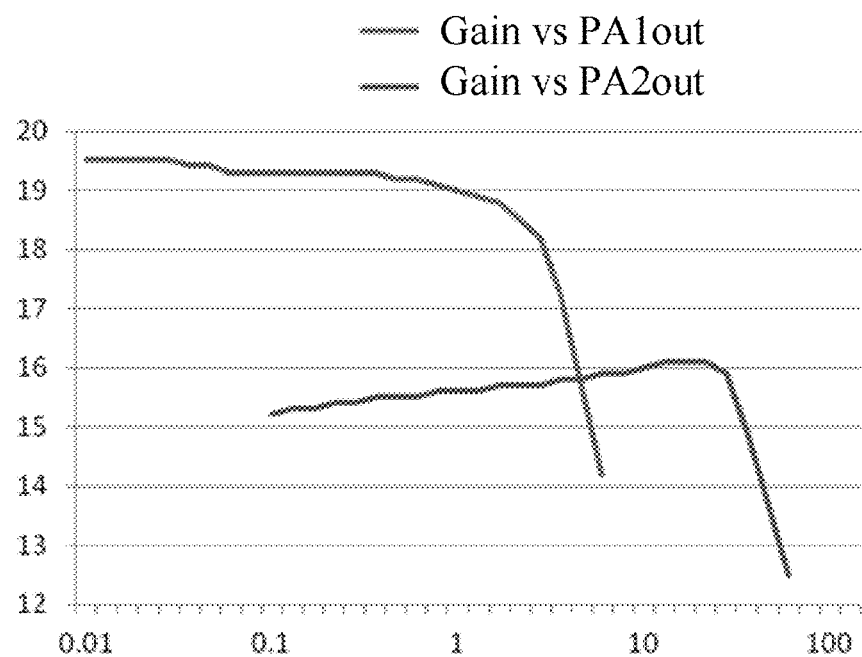
FIG. 6 is a gain curve of each stage of amplifier in an amplifier system according to an example embodiment of the disclosure.
Figure 7:
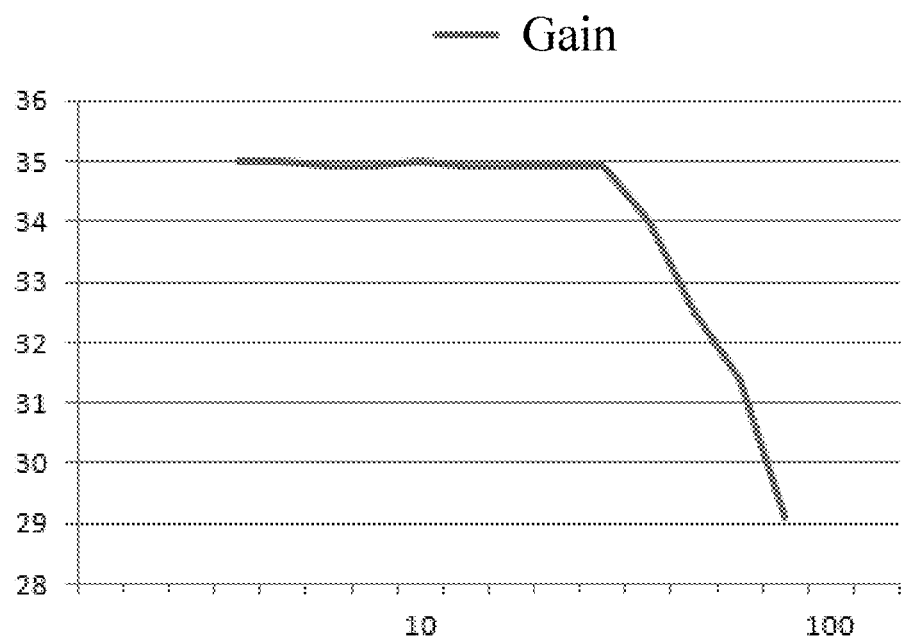
FIG. 7 is a gain curve of all cascaded stages of amplifiers in an amplifier system according to an example embodiment of the disclosure.

Furthermore, in accordance with a method for adjusting an amplifier system according to an embodiment of the disclosure, as shown in FIG. 6, according to the characteristic of a gain curve with respect to an LDMOS static current, under the condition of keeping large-small signal gains of an amplification link unchanged, the static working current value of the first-stage amplifier is adjusted to a value obtained by increasing a second value by a second pre-set multiple, so that the amplification characteristic of a first-stage small signal is changed, and an entire gain is improved; meanwhile, the static working current value of the second-stage amplifier is adjusted to a value obtained by decreasing a first value by a first pre-set multiple, so that the gain of a second-stage signal is reduced, and the adjusted entire gain of the amplification link is still kept consistent basically. As shown in FIG. 7, the linearity condition of the entire link is guaranteed.

Furthermore, the amplifier system provided by the embodiment of the disclosure may further include:

at least two bias circuits, correspondingly connected with the at least two stages of amplifiers and configured to control corresponding amplifiers to work stably.

In this case, the bias circuits can guarantee the normal working and stability of all stages of amplifiers, so as to guarantee the normal transmission of the amplification link.

Specifically, each of the at least two bias circuits include:

a voltage adjustment element, configured to adjust a gate voltage of the corresponding amplifier;

a temperature compensation element, connected with the voltage adjustment element; and a stability resistor, connected with the temperature compensation element.

In this case, each voltage adjustment element can adjust the gate voltage of the corresponding amplifier so as to bias the amplifier to a reasonable state; moreover, the corresponding temperature compensation element can keep the temperature of the amplifier constant, thereby avoiding the damage to the device caused by over-high temperature; and meanwhile, the corresponding stability resistor can make the amplifier work stably, thereby guaranteeing the normal transmission of the amplification link.

Moreover, the amplifier system provided by the embodiment of the disclosure may further include:

a power supply network, connected with the at least two stages of amplifiers and the at least two bias circuits respectively, and configured to supply power to the at least two stages of amplifiers and the at least two bias circuits.

In addition, the bias circuits and the power supply network may include a radio frequency element and a low frequency filter element respectively, and therefore the influence on the performance of a power amplification tube caused by a radio frequency power can be effectively prevented.

Another embodiment of the disclosure is illustrated below as follows.

Figure 8:
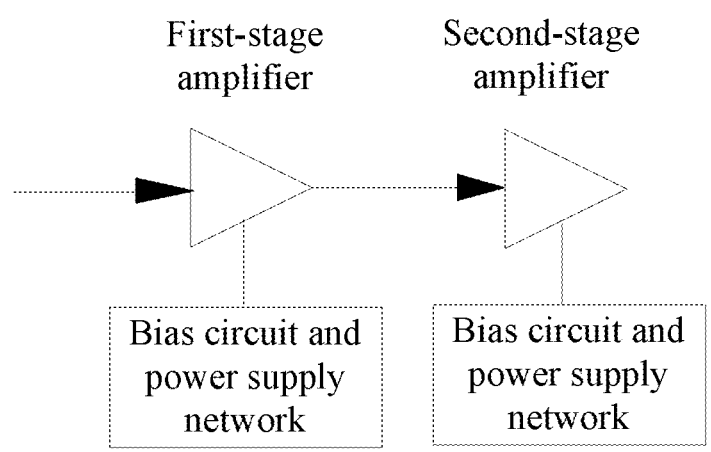
FIG. 8 is a structural schematic diagram of an amplifier system according to an example embodiment of the disclosure.

As shown in FIG. 8, an amplifier system provided by the embodiment of the disclosure includes two stages of amplifiers which are sequentially connected, two bias circuits connected with the two stages of amplifiers in a one-to-one correspondence manner, and a power supply network connected with the two stages of amplifiers and the two bias circuits respectively, wherein each of the at least two bias circuit includes a voltage adjustment element, a temperature compensation element and a stability resistor; the first-stage amplifier and the second-stage amplifier are amplifiers adopting LDMOS field-effect tubes and work in a class AB respectively; and in addition, a first pre-set multiple and a second pre-set multiple are any values between 0.4 and 0.6. Suppose a recommended static working current value of the first-stage amplifier is $A_1$ milliamp and a recommended static working current value of the second-stage amplifier is $B_1$ milliamp, a static working current value of the first-stage amplifier can be adjusted to $(1.4-1.6)*A_1$ milliamp, and a static working current value of the second-stage amplifier can be adjusted to $(0.4-0.6)*B_1$ milliamp. The power amplification efficiency is effectively improved under the condition of guaranteeing the linearity of an entire link.

Moreover, in accordance with a method for adjusting an amplifier system provided by the embodiment of the disclosure, as shown in FIG. 8, a static working current adjustment condition of the amplifier system is that: it is supposed that the first-stage amplifier is an amplifier adopting a power amplification tube MRF6S20010N, and the second-stage amplifier is an amplifier adopting a power amplification tube MRF6S27050H. In accordance with recommendations of a supplier, the recommended static working current value $A_1$ of the first-stage amplifier is 50 mA, the recommended static working current value $B_1$ of the second-stage amplifier is 480 mA, and the sum of static working currents is 530 mA; and after being adjusted in accordance with pre-set multiples, the static working current value of the first-stage amplifier can be 75 mA, the static working current value of the second-stage amplifier can be 290 mA, and the sum of the static working currents is 365 mA. Compared with the sum of the previous static working currents, the sum of the adjusted static working currents is decreased by 165 mA, and is decreased by 31% compared with an entire static current before adjustment; and in case of withdrawal for 10 dB, compared with the previous working current, the adjusted working current is decreased by 90 mA, and the efficiency is improved by about 10 percent, thereby effectively improving the power amplification efficiency under the condition of guaranteeing the linearity of the entire link.

Moreover, in accordance with the method for adjusting the amplifier system provided by the embodiment of the disclosure, as shown in FIG. 8, another static working current adjustment condition of the amplifier system is that: suppose the recommended static working current value $A_1$ of the first-stage amplifier is 50 mA and the recommended static working current value $B_1$ of the second-stage amplifier is 500 mA, the static working current value of the first-stage amplifier can be adjusted to 75 mA and the static working current value of the second-stage amplifier can be adjusted to 300 mA under the condition of keeping the gain of the entire link unchanged basically. The sum of the adjusted static working currents is decreased by 175 mA and is decreased by about 30 percent compared with the sum of the original static working currents. In this case, under the application condition of high withdrawal, the power amplification efficiency of an amplification link is greatly improved. In case of withdrawal for 10 dB, the working current can be probably decreased by about 10 percent, thereby effectively improving the power amplification efficiency under the condition of guaranteeing the linearity of the entire link.

On a basis of no increase of the circuit complexity, under the condition of guaranteeing the linearity of a power amplification link, the amplifier system provided by the embodiment of the disclosure effectively improves the power amplification efficiency by flexibly configuring all stages of static working currents of the cascaded amplifiers, has considerable flexibility, simplicity and applicability, is low in cost, and can be widely applied to the technical design of various amplifiers.

As the amplifier system provided by the embodiment of the disclosure is applied to a device, an embodiment of the disclosure also provides a device, which includes: the amplifier system as mentioned above in the embodiment, wherein, the implementation examples of the amplifier system are all applied to the embodiment of the device, and the same technical effect can be achieved.

The above is only example implementation modes of the disclosure. It should be pointed out that those skilled in the art can also make some improvements and modifications without departing from the principle of the disclosure. These improvements and modifications should fall within the protection scope of the disclosure.

INDUSTRIAL APPLICABILITY

As above, the amplifier system and the device provided by the embodiments of the disclosure have the beneficial effects as follows. On the basis of no increase of the circuit complexity, under the condition of guaranteeing the linearity of a power amplification link, the power amplification efficiency is effectively improved by flexibly configuring all stages of static working currents of the cascaded amplifiers, the flexibility, the simplicity and the applicability are considerable, the cost is low, and the amplifier system and the device can be widely applied to the technical design of various amplifiers.

What is claimed is:

1. An amplifier system, comprising:
    at least two stages of amplifiers which are sequentially connected, wherein a static working current value of an $N^{th}$-stage amplifier in the at least two stages of amplifiers is a value obtained by decreasing a first value by a first pre-set multiple, and a static working current value of an $(N-1)^{th}$-stage amplifier in the at least two stages of amplifiers is a value obtained by increasing a second value by a second pre-set multiple;
    the first value is a recommended static working current value corresponding to the $N^{th}$-stage amplifier, wherein N is any integer greater than or equal to 2; and
    the second value is a recommended static working current value corresponding to the $(N-1)^{th}$-stage amplifier;
    at least two bias circuits, correspondingly connected with the at least two stages of amplifiers and configured to control corresponding amplifiers to work stably;
    wherein each of the at least two bias circuits comprise:
    a voltage adjustment element, configured to adjust a gate voltage of a corresponding amplifier;
    a temperature compensation element, connected with the voltage adjustment element; and
    a stability resistor, connected with the temperature compensation element.

2. The amplifier system as claimed in claim 1, wherein the $N^{th}$-stage amplifier is an amplifier, having a maximum power capacity, in the at least two stages of amplifiers.

3. The amplifier system as claimed in claim 1, wherein the $N^{th}$-stage amplifier is a last-stage amplifier in the at least two stages of amplifiers.

4. The amplifier system as claimed in claim 1, wherein each of the at least two stages of amplifiers works in a class AB.

5. The amplifier system as claimed in claim 1, wherein each of the at least two stages of amplifiers is an amplifier adopting a Laterally Diffused Metal Oxide Semiconductor (LDMOS) field-effect tube.

6. The amplifier system as claimed in claim 1, wherein the first pre-set multiple and the second pre-set multiple are any values between 0.4 and 0.6.

7. The amplifier system as claimed in claim 1, further comprising:
    a power supply network, respectively connected with the at least two stages of amplifiers and the at least two bias circuits, and configured to supply power to the at least two stages of amplifiers and the at least two bias circuits.

8. A device, comprising: the amplifier system as claimed in claim 1.

9. A device, comprising: the amplifier system as claimed in claim 2.

10. A device, comprising: the amplifier system as claimed in claim 3.

11. A device, comprising: the amplifier system as claimed in claim 4.

12. A device, comprising: the amplifier system as claimed in claim 5.

13. A device, comprising: the amplifier system as claimed in claim 6.

14. A device, comprising: the amplifier system as claimed in claim 7.

* * * * *